(12) United States Patent
Fairchild

(10) Patent No.: US 9,247,656 B2
(45) Date of Patent: Jan. 26, 2016

(54) LATCH SYSTEM

(71) Applicant: Western Digital Technologies, Inc., Irvine, CA (US)

(72) Inventor: Robert G. Fairchild, Tustin, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 126 days.

(21) Appl. No.: 14/081,877

(22) Filed: Nov. 15, 2013

(65) Prior Publication Data

US 2015/0061475 A1    Mar. 5, 2015

Related U.S. Application Data

(60) Provisional application No. 61/872,508, filed on Aug. 30, 2013.

(51) Int. Cl.
| | |
|---|---|
| *H05K 5/00* | (2006.01) |
| *H05K 5/02* | (2006.01) |
| *G06F 1/16* | (2006.01) |

(52) U.S. Cl.
CPC ............ *H05K 5/0013* (2013.01); *G06F 1/1626* (2013.01); *H05K 5/0221* (2013.01)

(58) Field of Classification Search
CPC ............. H05K 5/00; H05K 5/02; H05K 5/03; H05K 7/18; H05K 5/0221; H05K 5/0217; H05K 5/0013; H02G 3/08; H02G 3/081; H02G 3/14; G06F 1/1626
USPC ........... 174/50, 520, 535, 559, 560, 561, 562, 174/66, 67; 220/3.2–3.9, 4.02, 241, 242; 361/600, 601, 679.01, 679.02, 679.43, 361/730, 740, 752; 312/223.1, 223.2
See application file for complete search history.

(56) References Cited

U.S. PATENT DOCUMENTS

| | | | |
|---|---|---|---|
| 5,251,104 A | 10/1993 | Wandt et al. | |
| 6,444,904 B1 | 9/2002 | Holman, IV et al. | |
| 6,570,088 B1 * | 5/2003 | Depp et al. ....................... | 174/50 |
| 6,664,472 B2 * | 12/2003 | Saneto et al. ................... | 174/66 |
| 7,701,705 B1 | 4/2010 | Szeremeta | |
| 7,796,381 B2 * | 9/2010 | Zuo et al. ................. | 361/679.01 |

(Continued)

FOREIGN PATENT DOCUMENTS

WO       2007046789       4/2007

OTHER PUBLICATIONS

Bruce A. Cariker et al., U.S. Appl. No. 14/134,350, filed Dec. 19, 2013, 18 pages.

(Continued)

*Primary Examiner* — Angel R Estrada

(57) ABSTRACT

A deflection or snap fit type latch system can resist separation in at least three axes. The snap fit type latch system can include a first member and a second member that when engaged are configured to form a snap fit connection, at least one of the members comprising a deflecting arm. A tee feature on the first member can include a stem and a head. A slot on the second member can slidingly receive the stem of the tee feature as the first and second members engage such that the second member is sandwiched between the first member and the head of the tee feature. The snap fit connection can resist separation in a first axis and the combined tee feature and slot resist separation in two additional axes. The snap fit type latch system can be part of an enclosure, such as a storage device.

21 Claims, 12 Drawing Sheets

(56) References Cited

U.S. PATENT DOCUMENTS

| | | | |
|---|---|---|---|
| 8,064,194 B2 | 11/2011 | Szeremeta | |
| 8,113,873 B1 | 2/2012 | Sarraf | |
| 8,133,426 B1 | 3/2012 | Yurchenco et al. | |
| 8,358,395 B1 | 1/2013 | Szeremeta | |
| 8,417,979 B2 | 4/2013 | Maroney | |
| 8,462,460 B1 | 6/2013 | Szeremeta et al. | |
| 8,467,174 B2 * | 6/2013 | Weng et al. | 361/679.01 |
| 8,498,088 B1 | 7/2013 | Klein | |
| 8,547,658 B1 | 10/2013 | Szeremeta | |
| 8,907,230 B2 * | 12/2014 | Chen et al. | 174/520 |
| 8,963,000 B2 * | 2/2015 | Xiao et al. | 174/520 |
| 2004/0174665 A1 | 9/2004 | Mockridge et al. | |
| 2007/0215498 A1 | 9/2007 | Barnette et al. | |
| 2011/0087165 A1 | 4/2011 | Amborn et al. | |
| 2013/0063876 A1 | 3/2013 | Pakula et al. | |

OTHER PUBLICATIONS

Malloy, Robert A., "Plastic Part Design for Injection Molding", 6.3 Snap Joint Assemblies, Dept. of Plastics Engineering, Univ. of Masachusetts, (1994), 24 pages.

Solvay Specialty Polymers, Technical Bulletin, "Snap-Fit Latch Design", www.SolvaySpecialtyPolymers.com, (2012), 5 pages.

BASF Corp., Technical Expertise Series, "Snap-Fit Design Manual", www.plasticsportal.com/usa, (2007), 24 pages.

Engineering Polymers—"Thermoplastics—A Design Guide, Part and Mold Design", Bayer MaterialScience, (2000), 3 pages.

DSM Engineering Plastics—Technical Guide, "Snap Fit Design", http://www.dsm.com/en_US/downloads/dep/snapfit_design.pdf, (2005), 9 pages.

International Search Report and Written Opinion dated Dec. 16, 2014 from related PCT Serial No. PCT/US2014/053601, 8 pages.

* cited by examiner

LATCH SYSTEM

CROSS-REFERENCE TO RELATED APPLICATIONS

This application claims priority to U.S. Provisional Application No. 61/872,508, filed on Aug. 30, 2013, which is herein incorporated by reference in its entirety.

BACKGROUND

Various types of devices use deflection latch systems to hold two parts together. They are common in the electronics industry and are often used in place of fasteners such as screws. Use of deflection latch systems can speed the assembly process, decrease production cost and reduce the number of parts. A deflection latch system may also be known as a snap latch, hook type deflection latch, or snap fit, among other names.

BRIEF DESCRIPTION OF THE DRAWINGS

These and other features, aspects and advantages are described below with reference to the drawings, which are intended to illustrate but not to limit the invention. In the drawings, like reference characters denote corresponding features consistently throughout similar embodiments.

DETAILED DESCRIPTION

Various types of devices use deflection latch systems to hold two parts together. They are common in the electronics industry and are often used in place of fasteners such as screws. Use of deflection latch systems can speed the assembly process, decrease production cost and reduce the number of parts. A deflection latch system may also be known as a snap latch, hook type deflection latch, or snap fit, among other names.

Figure 1:
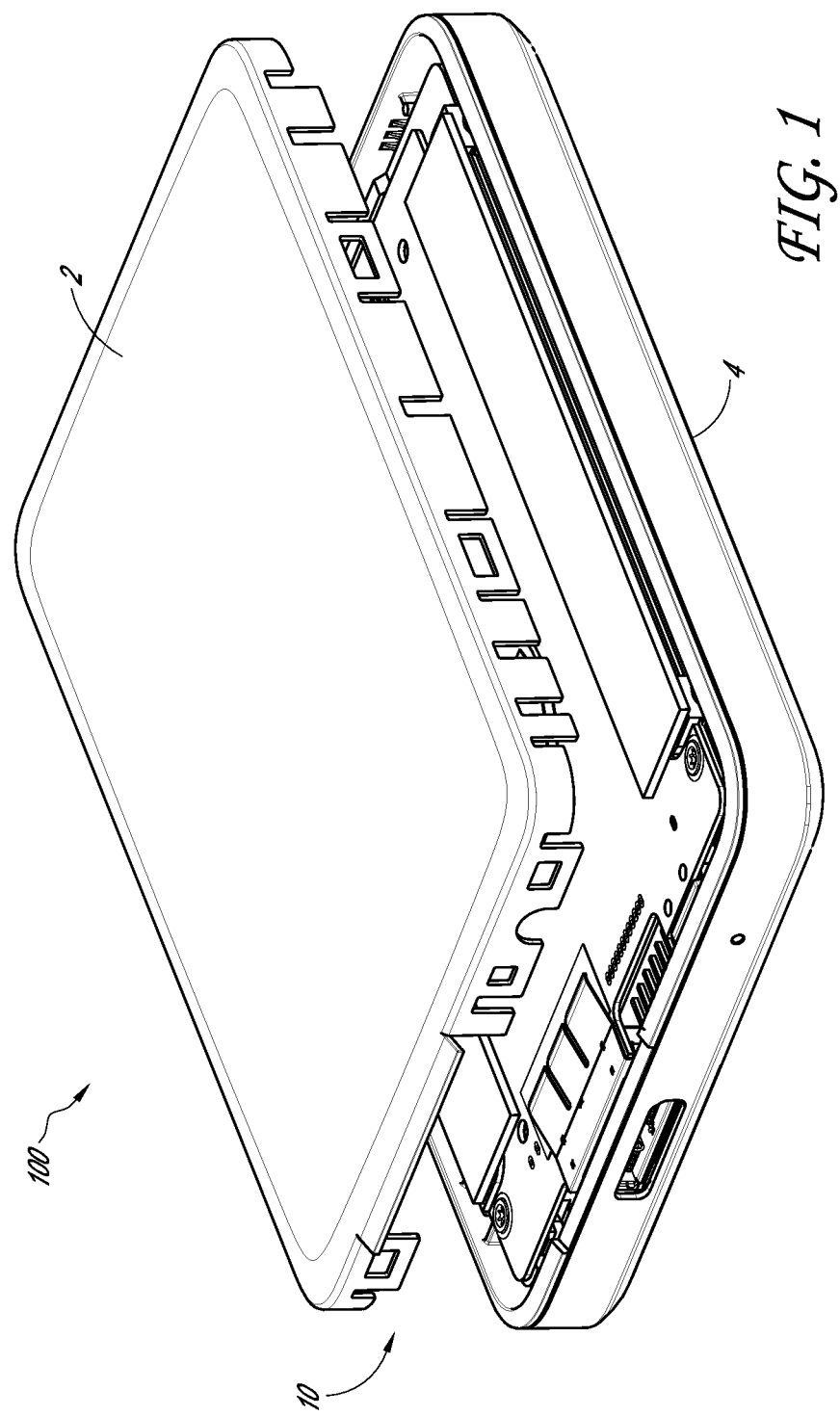
FIG. 1 is a partially exploded view of a storage drive.
Figure 2:
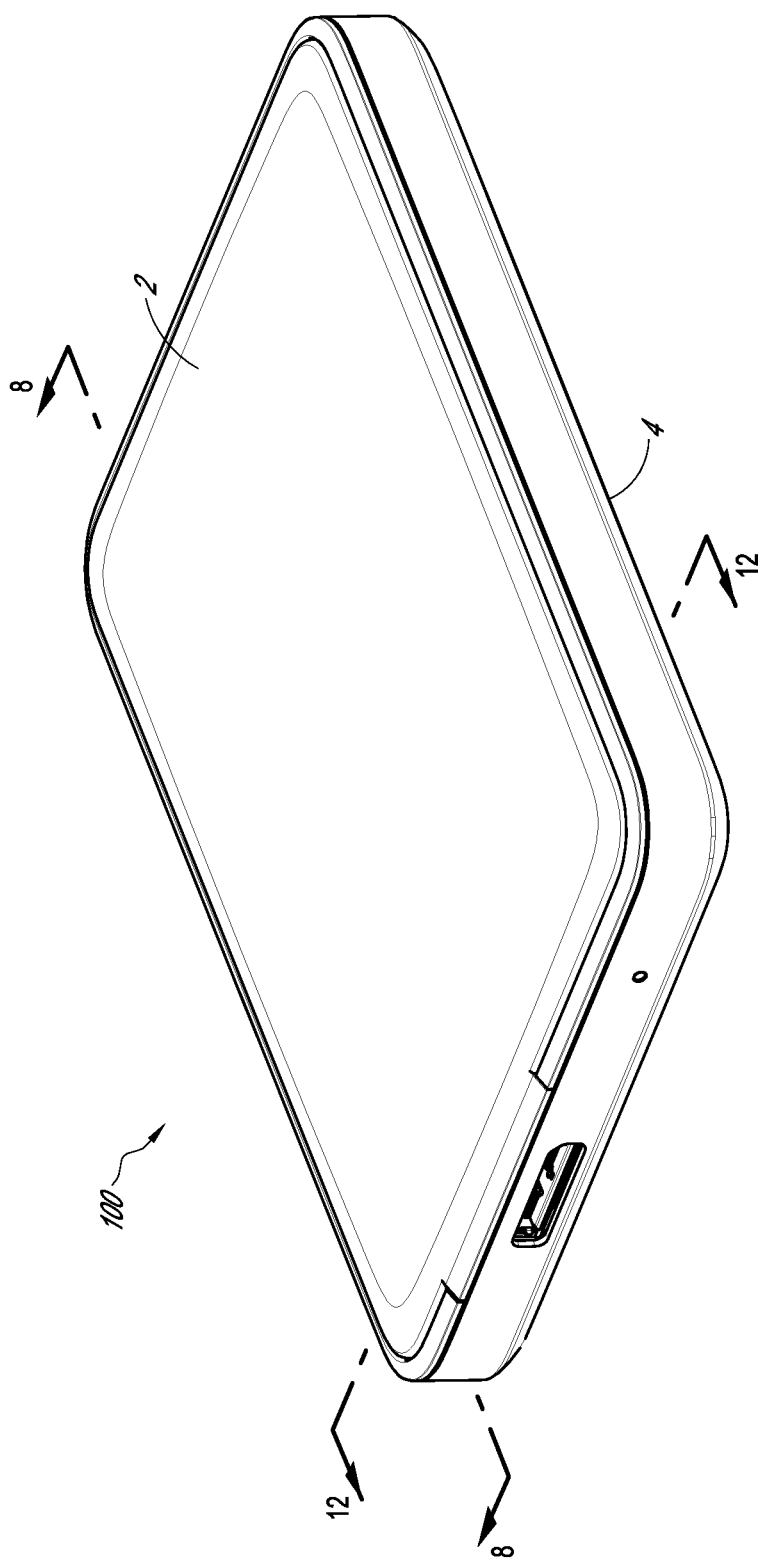
FIG. 2 shows the storage drive of FIG. 1 in an assembled condition.

FIGS. 1 and 2 show a device 100 that includes a deflection latch system 10. The device 100 shown is a storage drive; though the device can be any number of different devices, such as an electronic device, an appliance, an automobile, etc. The variety of different devices that use or can use deflection latch systems is truly unlimited.

Typically, deflection latch systems 10 connect two components 2, 4 with mating parts. In the illustrated example of FIGS. 1-2, the top 2 and bottom 4 of the enclosure 100 can connect with a deflection latch system 10. In a deflection latch system 10, the two parts move toward each other until the first part, such as a deflecting arm, of the latch system deflects over the mating part, such as a hook shape feature. If the system is kept in tension the latch system will resist the separation of the two parts until the deflection strength of the arm is overcome by a force. Another way to describe a deflection latch system is a mechanical joint system where part-to-part attachment is accomplished with locating and locking features (constraint features) that are homogenous with one or the other of the components being joined. Joining requires the (flexible) locking features to move aside for engagement with the mating part, followed by return of the locking feature toward its original position to accomplish the interference required to latch the components together. The mating part may be a locator feature, and may provide strength and stability in the attachment by being less flexible than the locking feature. Though, this is not always the case as two flexible locking features may also engage one another.

Example deflection based mating components for latch systems are discussed in the following documents: Robert A. Malloy, *Plastic Part Design for Injection Molding* §6.3 Snap Joint Assemblies (1994); Solvay Specialty Polymers, Technical Bulletin, *Snap-Fit Latch Design* (2012); BASF Corp., Technical Expertise Series, *Snap-Fit Design Manual* (2007); Bayer MaterialScience, Engineering Polymers-Thermoplastics-A Design Guide, Part and Mold Design 85-88 (2000) and DSM Engineering Plastics—Technical Guide, *Snap Fit Design* (2005). All of these documents are incorporated by reference herein and are to be considered part of the specification. In particular, these guides illustrate various different designs for deflection based mating components of deflection latch or snap fit systems which are all to be considered a part of this specification.

A deflection latch system can be used to attach plastic to plastic, metal to metal, or metal to plastic, among other materials.

Figure 3:
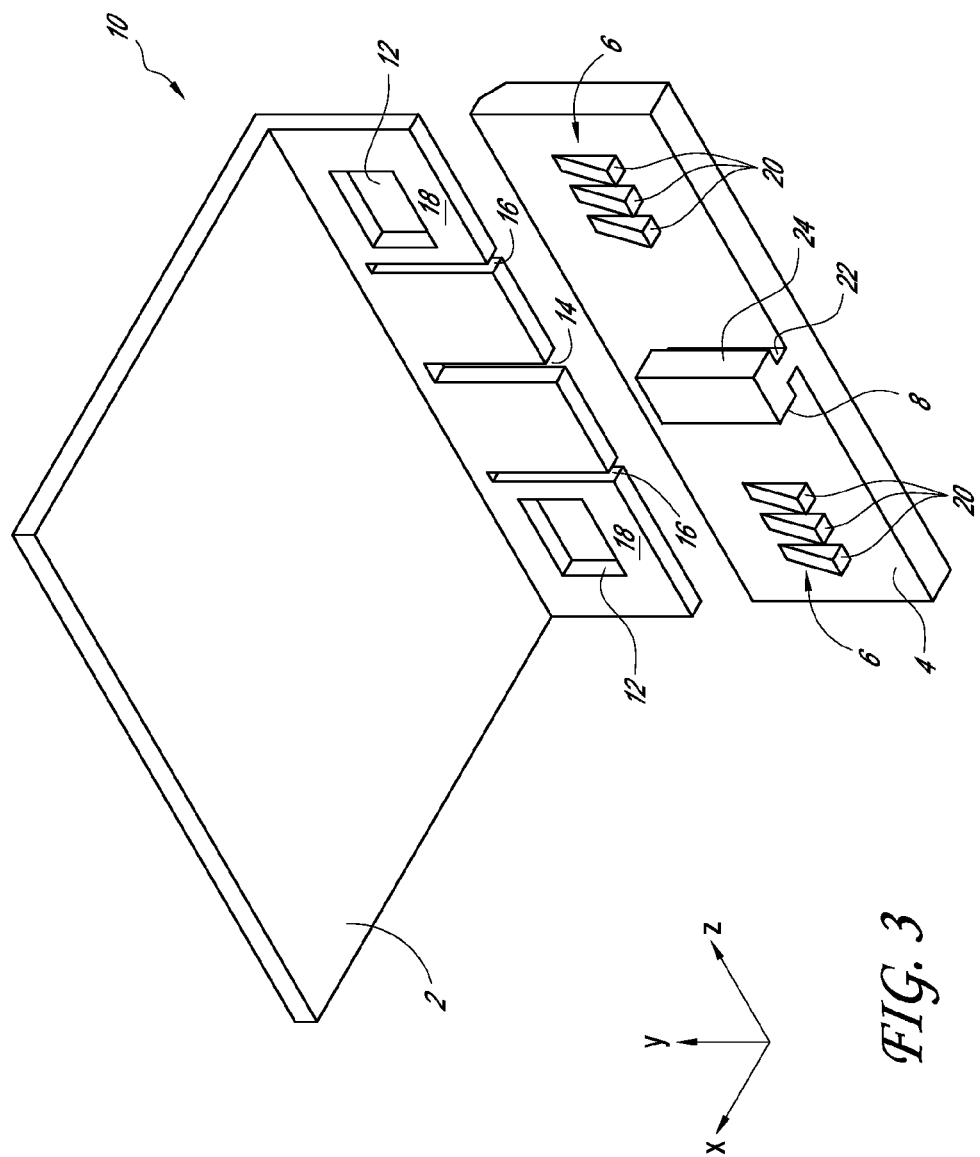
FIG. 3 illustrates a latch system in a first position.
Figure 4:
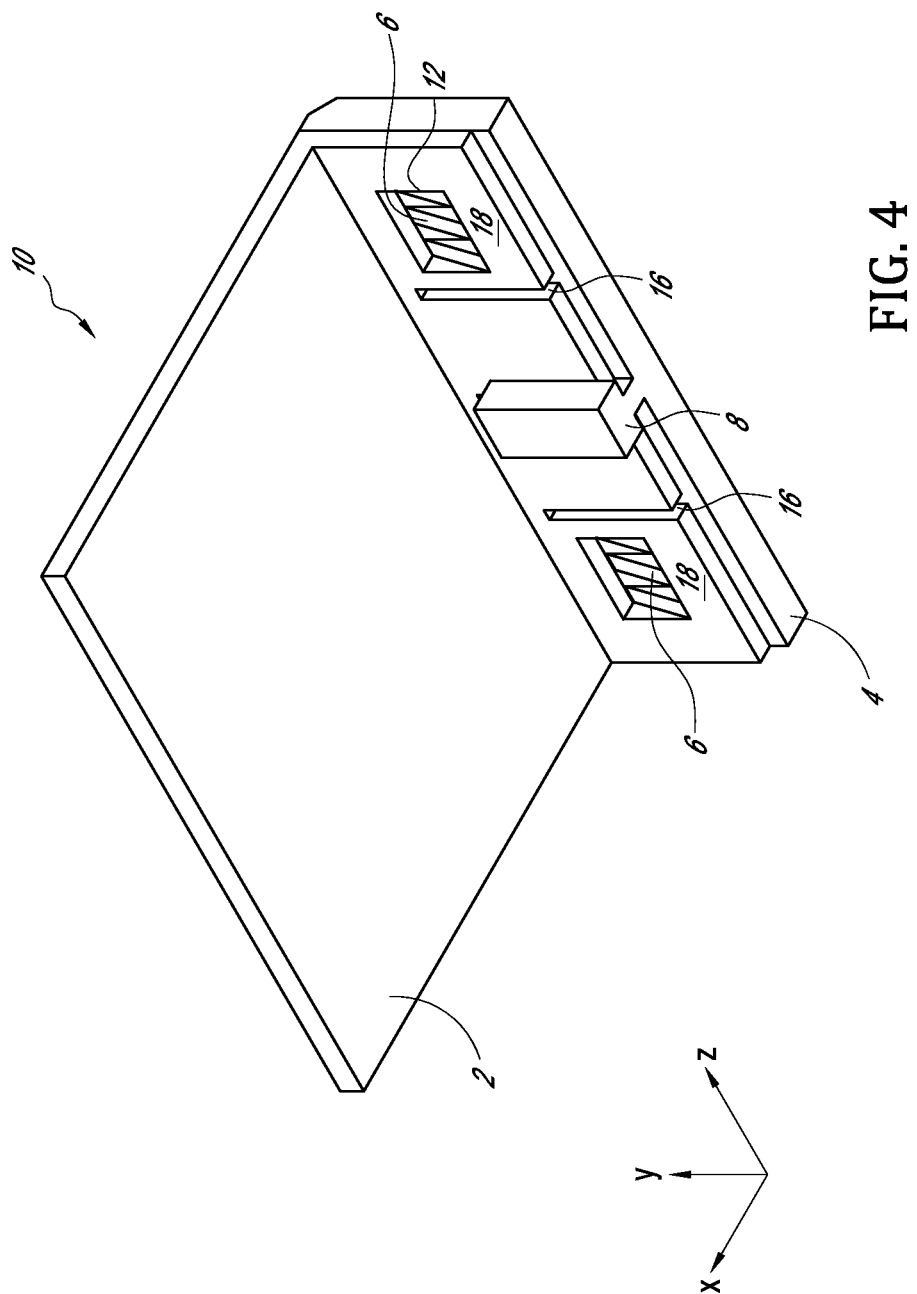
FIG. 4 shows the latch system in a second position.

FIGS. 3 and 4 illustrate one embodiment of a deflection latch system 10. Two mating parts 2, 4 are shown. The bottom part 4 includes two sets of hook shape latches 6 on either side of a tee feature 8. The top part 2 includes two loop latches 12 on either side of a mating tee slot 14. The top part 2 also shows optional slots 16 adjacent the loop latches 12. The loop latches 12 can be positioned on a deflecting arm 18. The optional slots 16 can be used to localize the deflection of the deflecting arm 18. Whether or not the optional slots 16 are present can be a factor of material selection, part thickness and length, among other factors. For example, a part made of a rigid metal may require the slot(s) 16, while the same part made of plastic may not.

FIG. 4 shows the mated parts 2, 4 with the hook shape latches 6 within the loop latches 12 and the tee feature 8 within the tee slot 14. As has been described above, moving the two mating parts 2, 4 together the deflecting arm 18 can bend out of plane until it passes the hook shape latches 6. The deflecting arm 18 can then return to its original shape, with the hook shape latches 6 positioned within the loop latches 12. In this way the two mating parts 2, 4 can be secured together.

It will be understood that any number of different shapes and configurations can be used to form the deflection based mating components of the latch system 10. In the illustrated embodiment, three triangular protrusions 20 (best seen in FIG. 3) are used to form a ramp that assists the deflection arm 18 in bending out of plane as the parts are moved past one another until the bottom of the loop 12 has passed the protrusions 20 and the opening of the loop 12 surrounds the protrusions 20. This allows the deflection arm 18 to snap back into its original, unbent position. In other embodiments, both parts can include deflecting arms 18, or only the part with the protrusion 20 can include the deflecting arm. In some of these embodiments, one or both parts can include ramps or hooks that engage one another. The above referenced guides, which are incorporated by reference, include various different designs for deflection based mating components of the latch system, any of which can be part of the various embodiments.

The deflection based mating components can be considered a first part of the latch system according to this disclosure. A second part will now be described with reference to the tee feature 8.

The tee feature 8 can slidingly engage the tee slot 14. The tee feature 8 can have a stem 22 and a head 24. The tee feature 8 according to certain embodiment can be in the shape of a letter "T", essentially a stem with an enlarged head. The head 24 can take the form of a pair of wings that extend from the stem. The stem 22 can extend outward from a wall or other features of the part 4, such that the head 24 is spaced from the wall. The tee slot 14 can be shaped to engage the stem 22. The thickness of the material around the tee slot 14 should also be such that the part 2 can fit between the part 4 holding the tee feature 8 and the head 24 of the tee feature 8. It will be understood that the slot 14 and the tee 8 can be on either part; this is generally not dependent on which part has the loop or latch of the latching system. Aesthetics, manufacturability, or other reasons may control which part 2, 4 has which feature(s).

The tee feature 8 can take any of a number of different forms. For example, the tee feature 8 could have the shape of half of a dumbbell with a bar and a ball or disk on the end. The tee feature can be tapered to have a small dimension near the wall of the part 4 holding the tee feature and a larger dimension at a point spaced therefrom. The tee feature can be in the form of one half of a "T" to only overhang the other part 2 on one side of the stem. In addition, the stem or head can be larger or smaller than the other in one or more dimensions. Thus, the head can extend generally perpendicularly (or at some other angle) from the stem in one, two, three, or four directions.

The tee feature 8 can eliminate or decrease the ability of the parts to separate left to right and in and out of the page with reference to FIG. 4 (x and z axes). While the hook and loop latch can eliminate or decrease the ability of the parts from separating vertically (y axis). In the illustrated embodiment, the hook and loop latch can also eliminate or decrease the ability of the parts from separating in and out (z axis), though other styles of deflection based mating components, such as a pair of mating hooks without additional features, may not have this ability.

Deflective type latches hold well when the force line is centered along the long axis of the deflection arm. They generally do not hold well when the force line is perpendicular to the long axis of the deflection arm. This condition may cause the mating surfaces of the latch system to simply slide off one another, releasing the latch. For example, shock induced through a free fall drop of the device at an acute angle to the latch arm may cause the two mating parts to shift or slide in a direction perpendicular to the centerline of the deflecting arm, effectively releasing the latch.

Snap together enclosures (plastic or metal or any other material) using hook type deflection latches are very effective at holding a top cover to the bottom base along its axis of deflection (latch in tension) when exposed to a shock condition. They tend to fail under shock conditions involving two or more degrees of freedom (typically shear motion relative to the latching axis). By integrating a two feature solution, such as a hook type deflection latch plus a Tee shape feature, the integrity of the latch system is improved long all three axes (X, Y and Z).

The improved latch system can advantageously eliminate or decrease an inherent weakness in the hook type latch system, failure under shock induced by sideways movement of the mating parts or by part distortion around the latch. When a tee feature is added to the latch system the result is a stronger latch system. When applied to an enclosure, the enclosure is better able to withstand greater shock without coming apart.

In some embodiments, adding the tee feature to a molded part has no or limited cost impact to the part, does not increase assembly time but greatly improves the structural integrity of the enclosure. In some embodiments, the slot and tee features pose no manufacturing obstacles and are adapted well to high volume production. No special manufacturing process may be required to add these features to the latching system.

In some embodiments, incorporating a simple slot in one part with a mating tee shape into a hook loop latch eliminates the disengaging of the hook latch under a shear load induced by free fall shock.

FIGS. 5-12 show an embodiment of an enclosure 100 with a latching system 10. It can be seen with particular reference to FIGS. 5 and 6, that each of the four mating sides of the enclosure include both a tee feature 8 and a deflection type latch 6. In some embodiments, an enclosure 100 can include a deflection latch system 10 on each mating side of the enclosure such that each side can have at least one tee feature 8, the corresponding slot 14 and a snap fit latch 6, 12.

Figure 5:
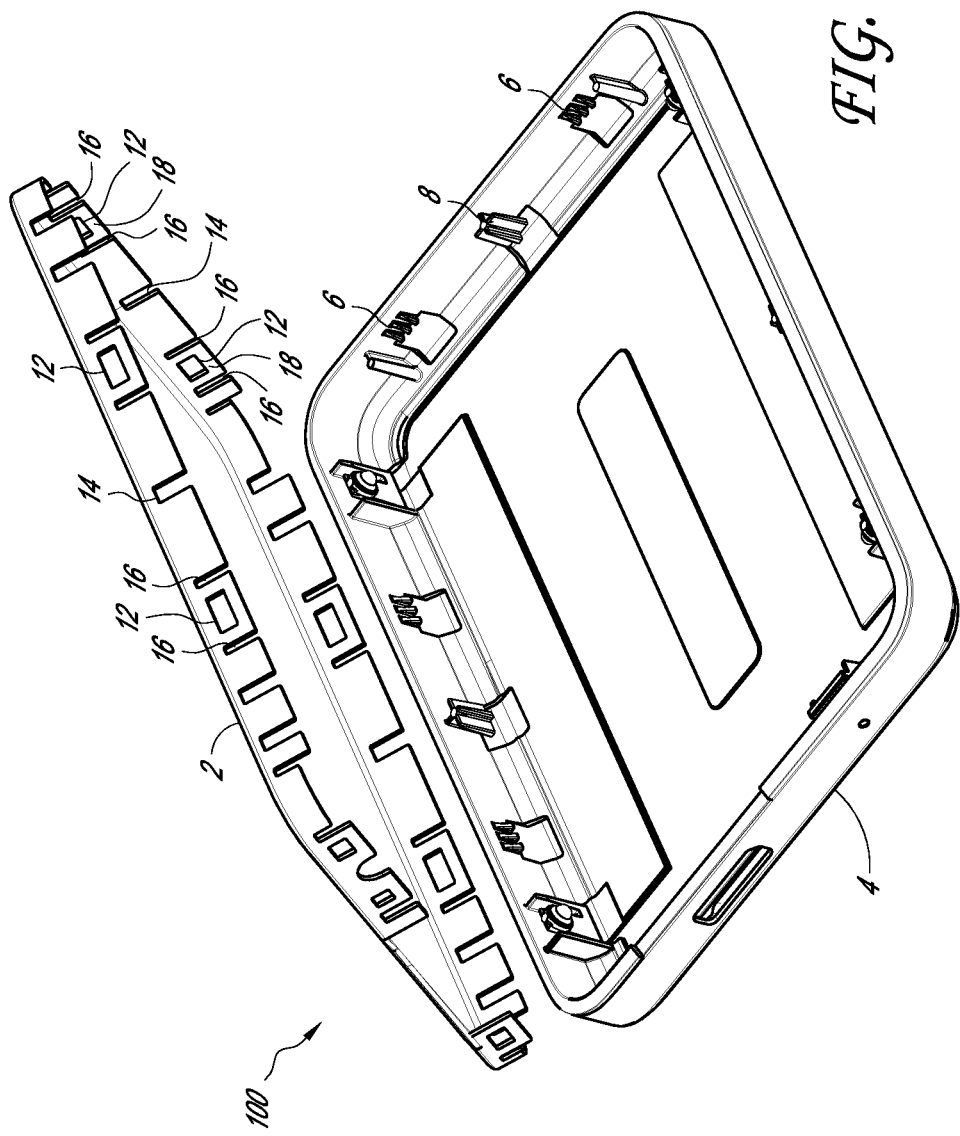
FIG. 5 shows a top and a bottom of an enclosure.
Figure 6:
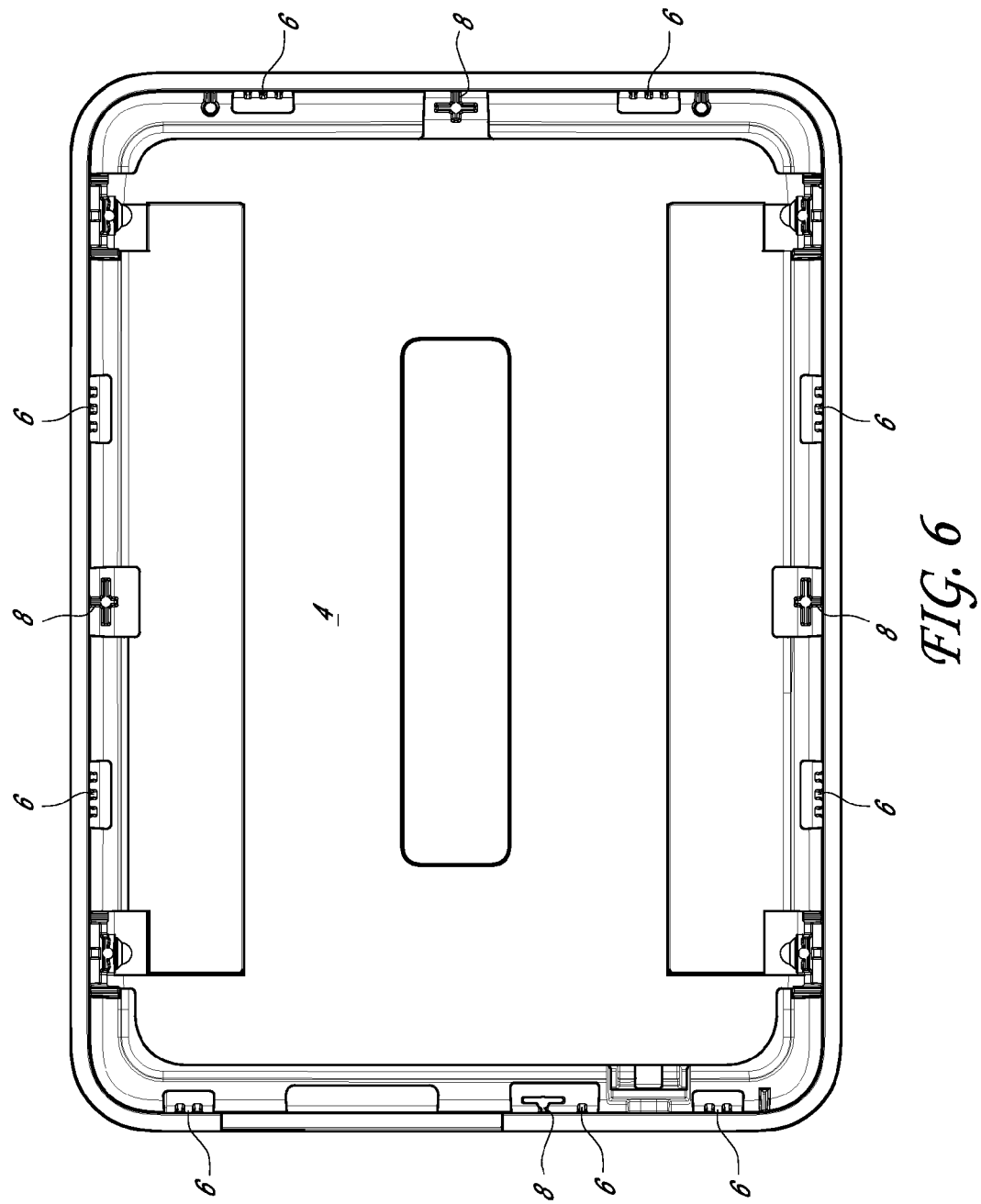
FIG. 6 is a top view of the bottom of the enclosure.

FIG. 5 shows the enclosure 100 in a separated state, where all of the deflection arms 18 having loop latches 12 can be seen. In addition, many of the tee features 8 and deflection type latches 6 can also be seen. FIG. 6 shows a top down view of the bottom part 4 of the enclosure 100. It can also be seen that the enclosure 100 has a few different variations of the deflection type latch 6, with one, two, or three protrusions 20 and correspondingly different sized loops 12. This is shown in greater detail in the section views that follow in FIGS. 7-12.

Figure 7:
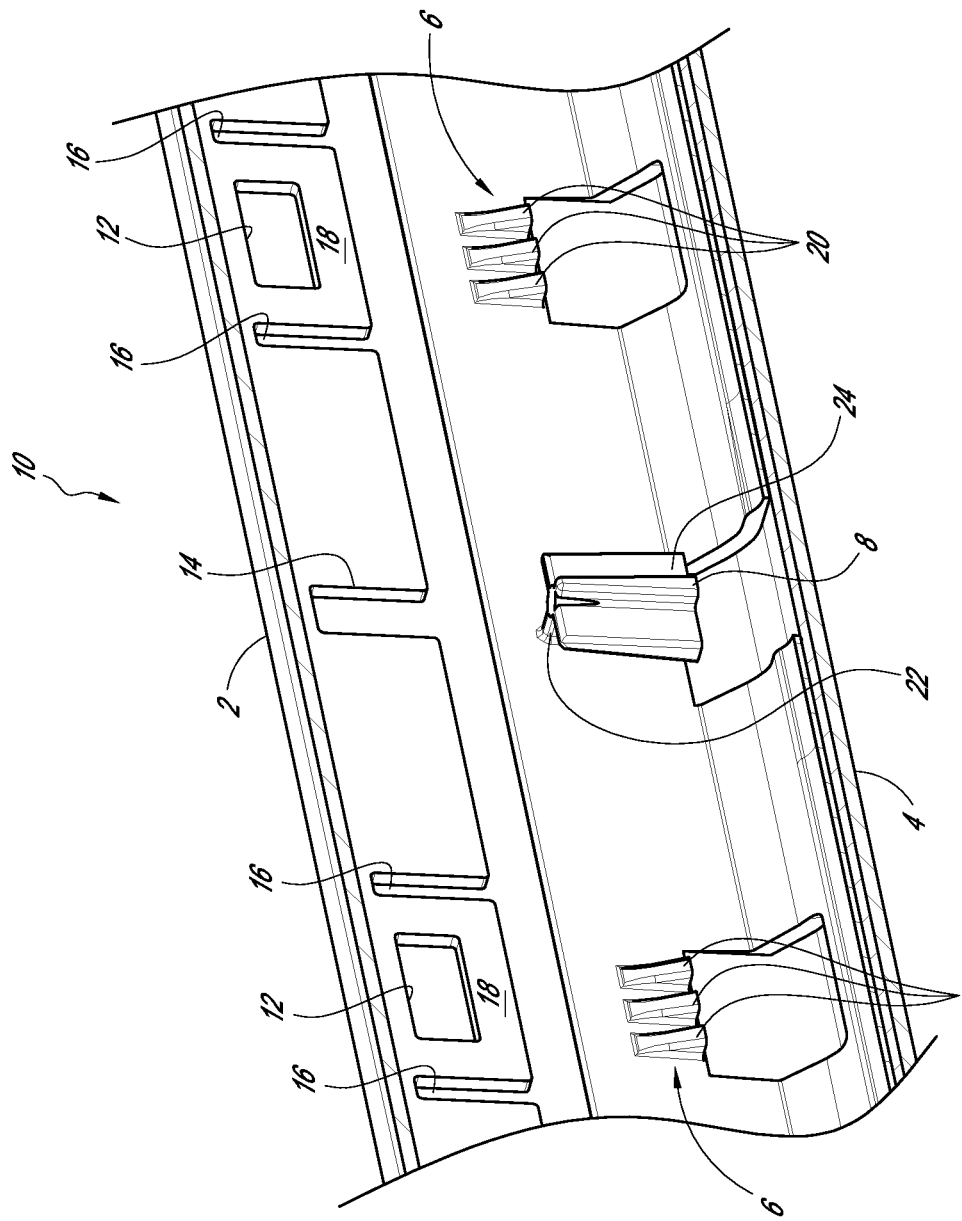
FIGS. 7 and 8 are cross-sectional and detail views of the enclosure showing a latch system in a first and a second position.
Figure 8:
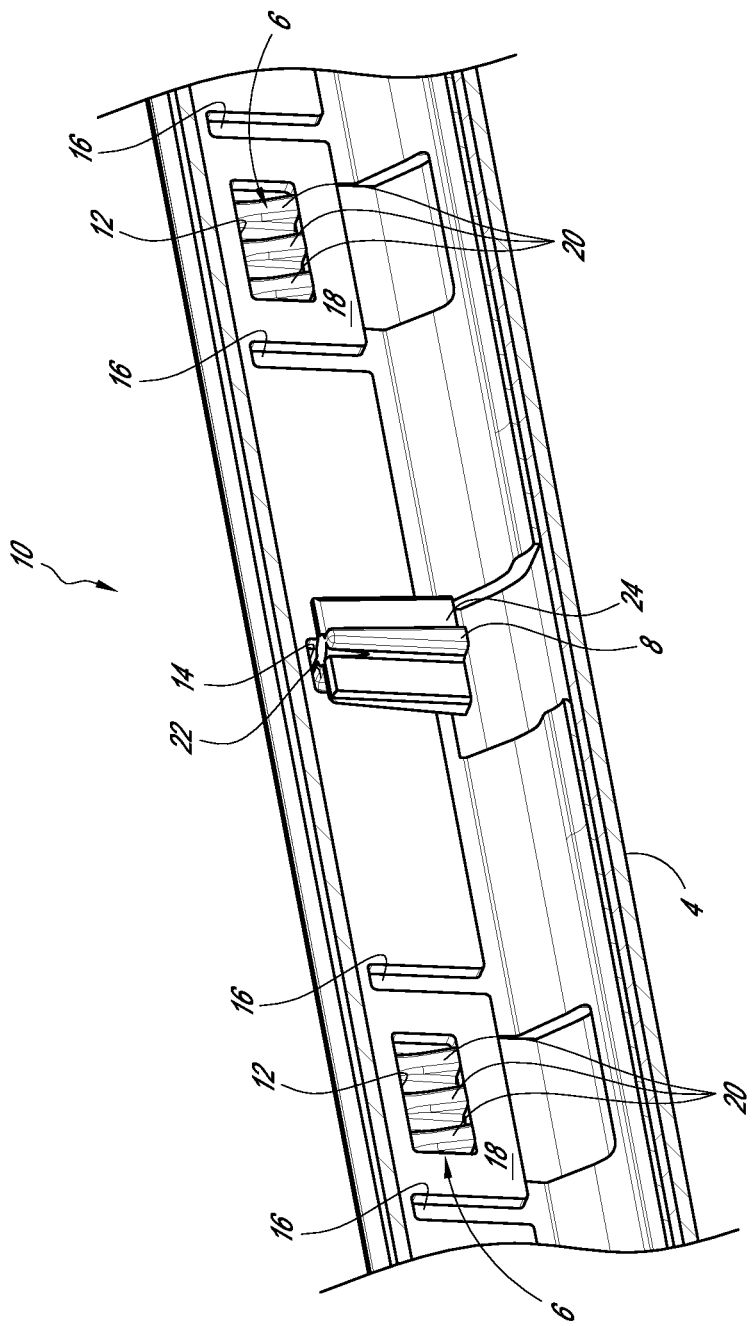
Figure 9:
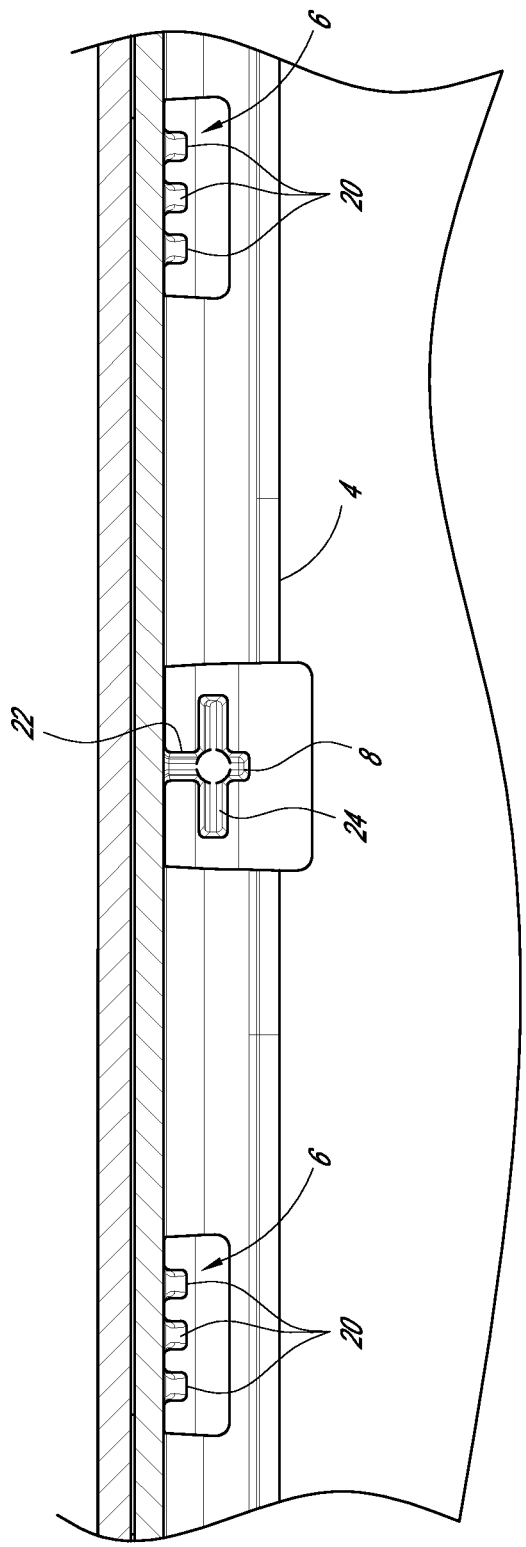
FIG. 9 is a cross-sectional, detail and top view of the bottom of the enclosure showing part of the latch system.
Figure 10:
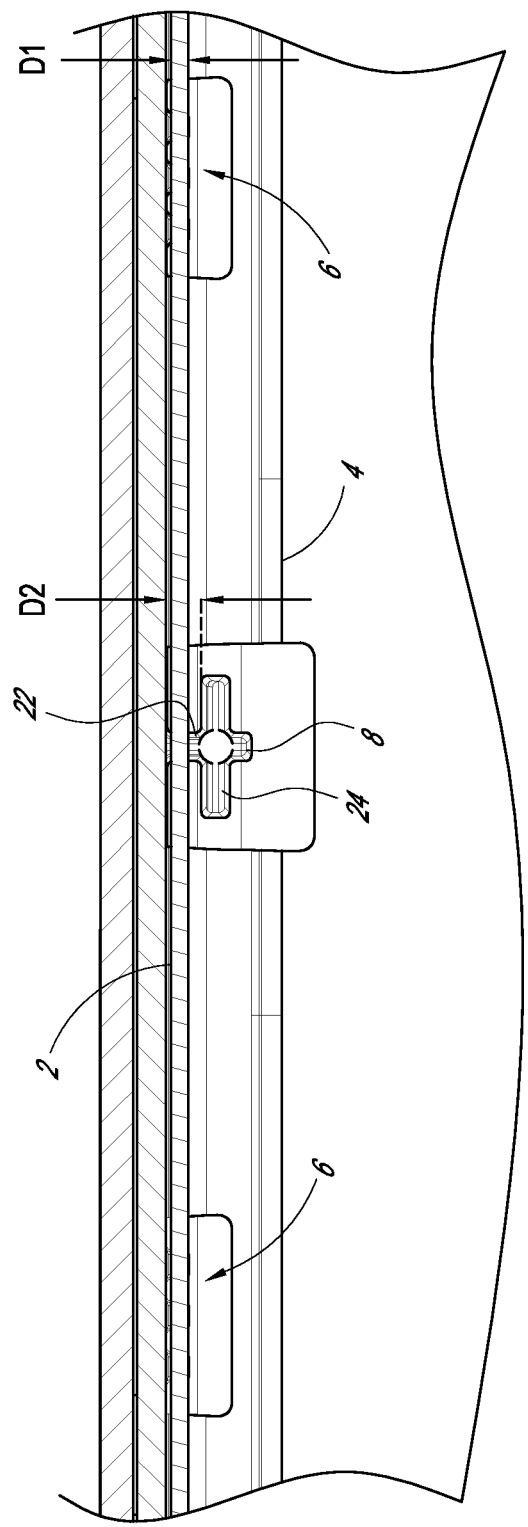
FIG. 10 illustrates a cross-sectional, detail and top view of the enclosure with the latch system in the second position.

Looking now to FIGS. 7 and 9, a section of the enclosure 100 is shown with a deflection latch system 10 in a separated state. FIGS. 8 and 10 show the same sections in a connected state. In the top down views shown in FIGS. 9 and 10, it can be seen how one part 2 is sandwiched between a wall on the other part 4 and the head 24 that extends outwardly like a pair of wings on the tee feature 8. The stem can attach to the wall at a base and extend to the head.

The space D2 between the wall of the part 4 and the head 24 can be dependent on a number of features. For example, it may be dependent on the thickness D1 of the part 2 positioned between the wall on the part 4 and the head 24. In addition, it may be dependent on features of the mating components of the snap fit latch such as their relative size or the amount of deflection required for them to engage. In some embodiments, the space D2 between the wall of the part 4 and the head 24 can be about 1, 2, or 3 times the thickness D1 of the part 2 positioned between the wall on the part 4 and the head 24. As shown in FIG. 10, the space D2 between the wall of the part 4 and the head 24 is slightly less than 2 times the thickness D1 of the part 2 positioned between the wall on the part 4 and the head 24. In some embodiments, the space D2 between the wall of the part 4 and the head 24 can be equal to the thickness D1 of the part 2 positioned between the wall on the part 4 and the head 24 plus the distance required for deflection by one or both parts when engaging the snap fit connection.

Figure 11:
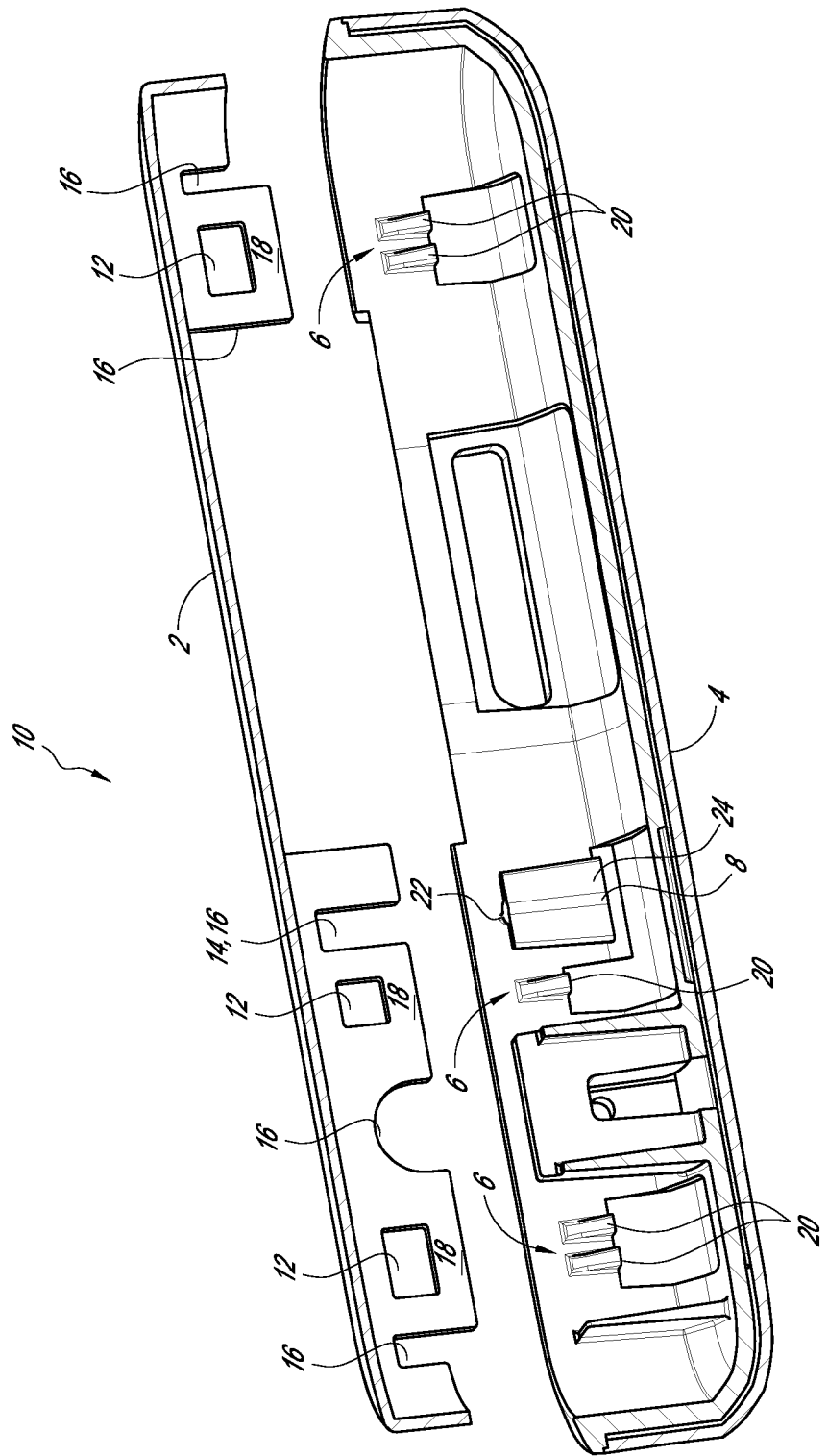
FIGS. 11 and 12 are cross-sectional and detail views of the enclosure showing another embodiment of a latch system in a first and a second position.
Figure 12:
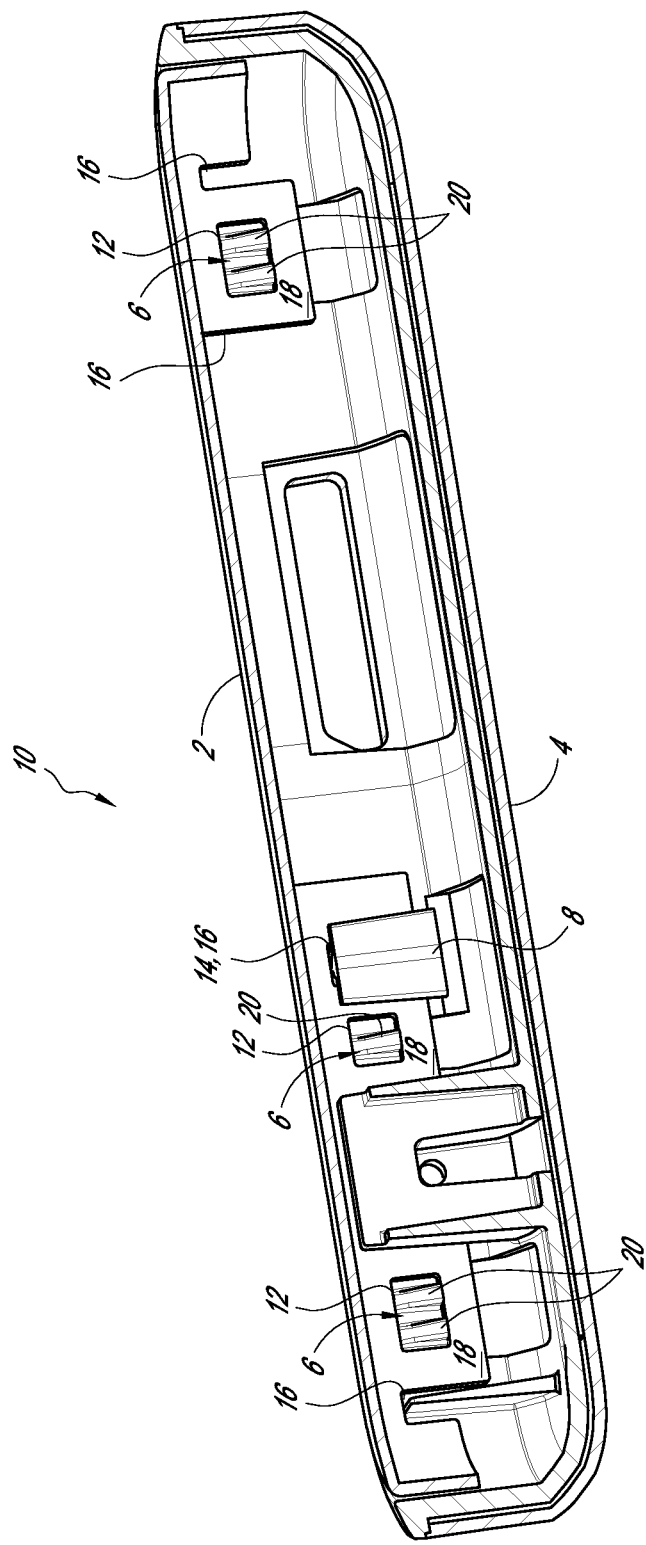

Looking now to FIGS. 11 and 12, a different section of the enclosure 100 is shown with a deflection latch system 10 in a separated and then a connected state. As can be seen, certain features of the deflection latch system 10 of FIGS. 11 and 12 are different from those shown in FIGS. 7-10. For example, whereas previously, three protrusions 20 were shown for the deflection type latch 6, one and two protrusions 20 are shown here with correspondingly smaller sized loops 12.

In addition, one of the slots 16 is rounded and another is forms a large opening substantially larger than the other slots 16. Though, these slots can still be used to localize the deflection of the deflecting arm 18. In addition, the tee slot 14 is also being used as a slot 16 to localize the deflection of the deflecting arm 18, without a separate slot.

In some embodiments the tee feature 8 can be adjacent the deflection type latch 6 such as shown in FIGS. 11 and 12. In some embodiments, the tee feature can be spaced from the deflection type latch. At the same time, these two features should be positioned close enough to prevent separation along all three axes. The space between the two features can vary greatly and can depend on factors such as, material, material thickness, part length, size of the device, shape and style of both the deflection type latch and the tee feature, etc. Generally, it is preferred to have at least one of each feature on each side of the device being connected. For example, an enclosure may have a deflection type latch positioned on either side of a corner, such that there are two deflection type latches on each side of the enclosure. The enclosure can also include at least one tee feature on each side. The tee feature can be positioned between the two deflection type latches on that same side. In some embodiments, one tee feature could be associated with or adjacent each deflection type latch.

A keying feature can be used with a latch system to provide further support. The keying feature can be (ribs, pins or tabs) located on one part, mating with the second part, can help resist this sideways slip between parts under shock conditions. They may become ineffective if the shock induces warping or distortion of the structure around the latch system thus allowing the latch local surfaces to separate. The tee feature can be a type of keying feature and can provide additional benefits.

The tee feature can eliminate or decrease two dimensional side to side movement (both directions relative to the long axis of the deflective arm) of parts under a shock condition. The tee feature is preferably strategically located close to the deflective latch to eliminate structure warpage or distortion during a shock condition. Thus, even if a first deflective latch were to disengage during a shock condition, the tee feature can help prevent a ripple affect where the next closest deflective latch disengages after the first one disengages and so on down the line until the enclosure is no longer secured together. Rather, the shock wave passes to the tee feature but is reduced because of the additional control on movement along the different axes. This can prevent the shock wave from passing to the adjacent deflective latch with sufficient force to disengage the adjacent deflective latch.

In some embodiments, a latch system for securing a first enclosure section to a second enclosure section, the latch system can comprises a tee feature with hook shape latches for attachment to the first enclosure section and a mating tee slot with loop latches for attachment to the second enclosure section.

According to certain embodiments, a deflection latch system can comprise two mating parts, at least one of the parts having a deflecting arm for engaging a corresponding feature on the other part. At least one of the mating parts can have a tee feature extending from the part perpendicular to the axis of deflection of the deflecting arm, the other part can have a corresponding slot for receiving a stem of the tee feature.

In some embodiments, an enclosure can include first and second mating members and a latch system for securing the first mating member to the second mating member. The latch system can comprise a deflecting arm, a tee feature and a receiving slot. The deflecting arm can be on one of the first mating member and the second mating member for engaging a corresponding feature on the other member. The deflecting arm has a deflecting arm surface configured such that when the first and second mating members are moved towards engagement, the deflecting arm surface will flex when moved over the corresponding feature and then return to its original shape as the deflecting arm and the corresponding feature engage, thereby locking the mating members in place. The tee feature on the first mating member can have a head and a stem. The stem can extend between the head and a base on the first mating member. The receiving slot can be on the second mating member to slidingly receive the stem of the tee feature. When the first and second mating members are locked in place, the stem can extend in a direction predominantly perpendicular to the deflecting arm surface and at least a portion of the second mating member adjacent the receiving slot is sandwiched between the head and a portion of the first mating member adjacent the base of the stem.

In some embodiments, the deflecting arm can be at least one of a loop, an opening, a hook, a ledge, a flange, a rim, and a ramp. For example, the deflecting arm can be a loop and the corresponding feature is at least one of a hook and a ramp. The deflecting arm can be on the first or second mating member. A deflection slot can be positioned between the deflecting arm and the receiving slot or tee feature to isolate deflection of the deflecting arm from the receiving slot or tee feature.

In some embodiments, the latch system can comprise two deflecting arms and corresponding features, and one tee feature and receiving slot, wherein when the first and second mating members are locked in place the tee feature and receiving slot are positioned between the two deflecting arms. Each of the first and second mating members can comprise four sides configured to mate with four sides of the other member, each mating pair of sides comprising at least one of the latch systems.

In some embodiments, each of the first and second mating members comprise four sides configured to mate with four sides of the other member, each mating pair of sides comprising at least one of the latch systems.

In some embodiments, the head comprises a pair of wings that extend radially outward from the stem on opposite sides of the stem.

In some embodiments, the enclosure comprises a storage device.

According to certain embodiments, a snap fit type latch system that resists separation in three axes can comprise a first member and a second member that when engaged are configured to form a snap fit connection, at least one of the members comprising a deflecting arm; a tee feature on the first member comprising a stem and a head; and a slot on the second member to slidingly receive the stem of the tee feature as the first and second members engage such that the second member is sandwiched between the first member and the head of the tee feature. The snap fit connection can resist separation in a first axis and the combined tee feature and slot resist separation in two additional axes.

In some embodiments, the snap fit connection can comprise a loop and a hook that resist separation in the first axis as well as along one of the additional axes. The tee feature can be perpendicular to a plane defined by the deflecting arm when the first and second members are engaged.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above.

What is claimed is:

1. An enclosure comprising first and second mating members and a latch system for securing the first mating member to the second mating member, the latch system comprising:
    a deflecting arm on one of the first mating member and the second mating member for engaging a corresponding feature on the other member, the deflecting arm comprising a deflecting arm surface configured such that when the first and second mating members are moved towards engagement, the deflecting arm surface will flex when moved over the corresponding feature and then return to its original shape as the deflecting arm and the corresponding feature engage, thereby locking the mating members in place;
    a tee feature on the first mating member, the tee feature having a head and a stem, the stem extending between the head and a base on the first mating member; and
    a receiving slot on the second mating member to slidingly receive the stem of the tee feature; and
    a deflection slot positioned between the deflecting arm and one of the tee feature and the receiving slot;
    wherein when the first and second mating members are locked in place, the stem extends in a direction predominantly perpendicular to the deflecting arm surface and at least a portion of the second mating member adjacent the receiving slot is sandwiched between the head and a portion of the first mating member adjacent the base of the stem.

2. The enclosure of claim 1, wherein the deflecting arm comprises at least one of a loop, an opening, a hook, a ledge, a flange, a rim, and a ramp.

3. The enclosure of claim 2, wherein the deflecting arm comprises a loop and the corresponding feature is at least one of a hook and a ramp.

4. The enclosure of claim 1, wherein the deflecting arm is on the second mating member.

5. The enclosure of claim 1, wherein the latch system comprises:
    two deflecting arms and corresponding features; and
    one tee feature and receiving slot, wherein when the first and second mating members are locked in place the tee feature and receiving slot are positioned between the two deflecting arms.

6. The enclosure of claim 5, wherein each of the first and second mating members comprise four sides configured to mate with four sides of the other member, each mating pair of sides comprising at least one of the latch systems.

7. The enclosure of claim 1, wherein each of the first and second mating members comprise four sides configured to mate with four sides of the other member, each mating pair of sides comprising at least one of the latch systems.

8. The enclosure of claim 1, wherein the head comprises a pair of wings that each extends radially outward from the stem on opposite sides of the stem.

9. The enclosure of claim 1, wherein the enclosure comprises a storage device.

10. An enclosure comprising first and second mating members and a latch system for securing the first mating member to the second mating member, the latch system comprising:
    a deflecting arm on the second mating member for engaging a corresponding feature on the other member, the deflecting arm comprising a deflecting arm surface configured such that when the first and second mating members are moved towards engagement, the deflecting arm surface will flex when moved over the corresponding feature and then return to its original shape as the deflecting arm and the corresponding feature engage, thereby locking the mating members in place;
    a tee feature on the first mating member, the tee feature having a head and a stem, the stem extending between the head and a base on the first mating member;
    a receiving slot on the second mating member to slidingly receive the stem of the tee feature; and
    a deflection slot positioned between the deflecting arm and the receiving slot on the second mating member to isolate deflection of the deflecting arm from the receiving slot;
    wherein when the first and second mating members are locked in place, the stem extends in a direction predominantly perpendicular to the deflecting arm surface and at least a portion of the second mating member adjacent the receiving slot is sandwiched between the head and a portion of the first mating member adjacent the base of the stem.

11. The enclosure of claim 10, wherein the deflecting arm comprises at least one of a loop, an opening, a hook, a ledge, a flange, a rim, and a ramp.

12. The enclosure of claim 11, wherein the deflecting arm comprises a loop and the corresponding feature is at least one of a hook and a ramp.

13. The enclosure of claim 10, wherein the latch system comprises:
    two deflecting arms and corresponding features; and
    one tee feature and receiving slot, wherein when the first and second mating members are locked in place the tee feature and receiving slot are positioned between the two deflecting arms.

14. The enclosure of claim 13, wherein each of the first and second mating members comprise four sides configured to mate with four sides of the other member, each mating pair of sides comprising at least one of the latch systems.

15. The enclosure of claim 10, wherein each of the first and second mating members comprise four sides configured to mate with four sides of the other member, each mating pair of sides comprising at least one of the latch systems.

16. The enclosure of claim 10, wherein the head comprises a pair of wings that each extends radially outward from the stem on opposite sides of the stem.

17. The enclosure of claim 10, wherein the enclosure comprises a storage device.

18. An enclosure comprising:
a first mating member comprising a first surface and a side wall that extends outward from and perpendicular to the first surface;
a second mating member comprising a second surface and a flange that extends outward from and perpendicular to the second surface; and
a plurality of latch systems, each latch system comprising:
   a snap fit connection formed by a first mating component on the side wall of the first mating member and a second mating component on the flange of the second mating member, at least one of the first and second mating components comprising a deflecting arm;
   a tee feature on the first member comprising a stem and a head; and
   a slot on the flange to slidingly receive the stem of the tee feature as the first and second members engage such that the flange is sandwiched between and in direct contact with the side wall of the first member and the head of the tee feature, the side wall forming an outer surface of the enclosure;
   wherein the snap fit connection resists separation in a first axis and the combined tee feature and slot resist separation in two additional axes.

19. The enclosure of claim 18, wherein the side wall comprises four side walls, the flange comprises four flanges, and the plurality of latch systems comprises at least four latch systems such that four snap fit connections are formed between the four side walls and the four flanges, each of the four outer side walls being engaged with one of the four flanges at one of the at least four snap fit connections.

20. The enclosure of claim 18, wherein the first mating component comprises a loop and the second mating component comprises a hook configured to engage the loop.

21. The enclosure of claim 18, wherein the tee feature is perpendicular to a plane defined by the deflecting arm when the first and second mating members are engaged.

* * * * *